United States Patent [19]

Huss

[11] 4,308,301

[45] Dec. 29, 1981

[54] PROCESS FOR METAL-COATING PLASTIC SURFACES

[75] Inventor: Rainer Huss, Kircheim, Fed. Rep. of Germany

[73] Assignee: SEP Gesellschaft fur technische Studien Entwicklung Planung mbH, Munich, Fed. Rep. of Germany

[21] Appl. No.: 156,060

[22] Filed: Jun. 3, 1980

[30] Foreign Application Priority Data

Jun. 12, 1979 [DE] Fed. Rep. of Germany ....... 2923710

[51] Int. Cl.$^3$ ............................................. B05D 3/04
[52] U.S. Cl. ................................... 427/307; 156/646; 156/668; 427/304; 427/305; 427/306; 427/444
[58] Field of Search ............................... 427/304–307, 427/444; 156/646, 668

[56] References Cited

U.S. PATENT DOCUMENTS

| | | | |
|---|---|---|---|
| 2,400,720 | 5/1946 | Staudinger | 156/646 |
| 3,740,252 | 6/1973 | Chaikin | 156/646 |
| 4,039,714 | 8/1977 | Roubal et al. | 427/307 |
| 4,208,241 | 6/1980 | Harshbarger | 156/646 |

Primary Examiner—Michael R. Lusignan
Assistant Examiner—Janyce A. Bell
Attorney, Agent, or Firm—Strimbeck, Davis & Soloway

[57] ABSTRACT

A process for metal-coating plastic surfaces by chemical pretreatment with an acid pickling agent whereby to prepare the plastic surfaces for the subsequent superposition thereon of a metal layer is described. The plastic surfaces to be coated are chemically pretreated by means of an acid pickling agent in the gaseous phase, the chemical pretreatment is then terminated by chemical reaction of the said pickling agent with another material in the gaseous phase to form gaseous reaction products. If desired, the chemically pretreated plastic surface may then be treated with an aldehyde in solution. The treated surface may then be metal coated, if desired employing a galvanic process without external current.

14 Claims, 1 Drawing Figure

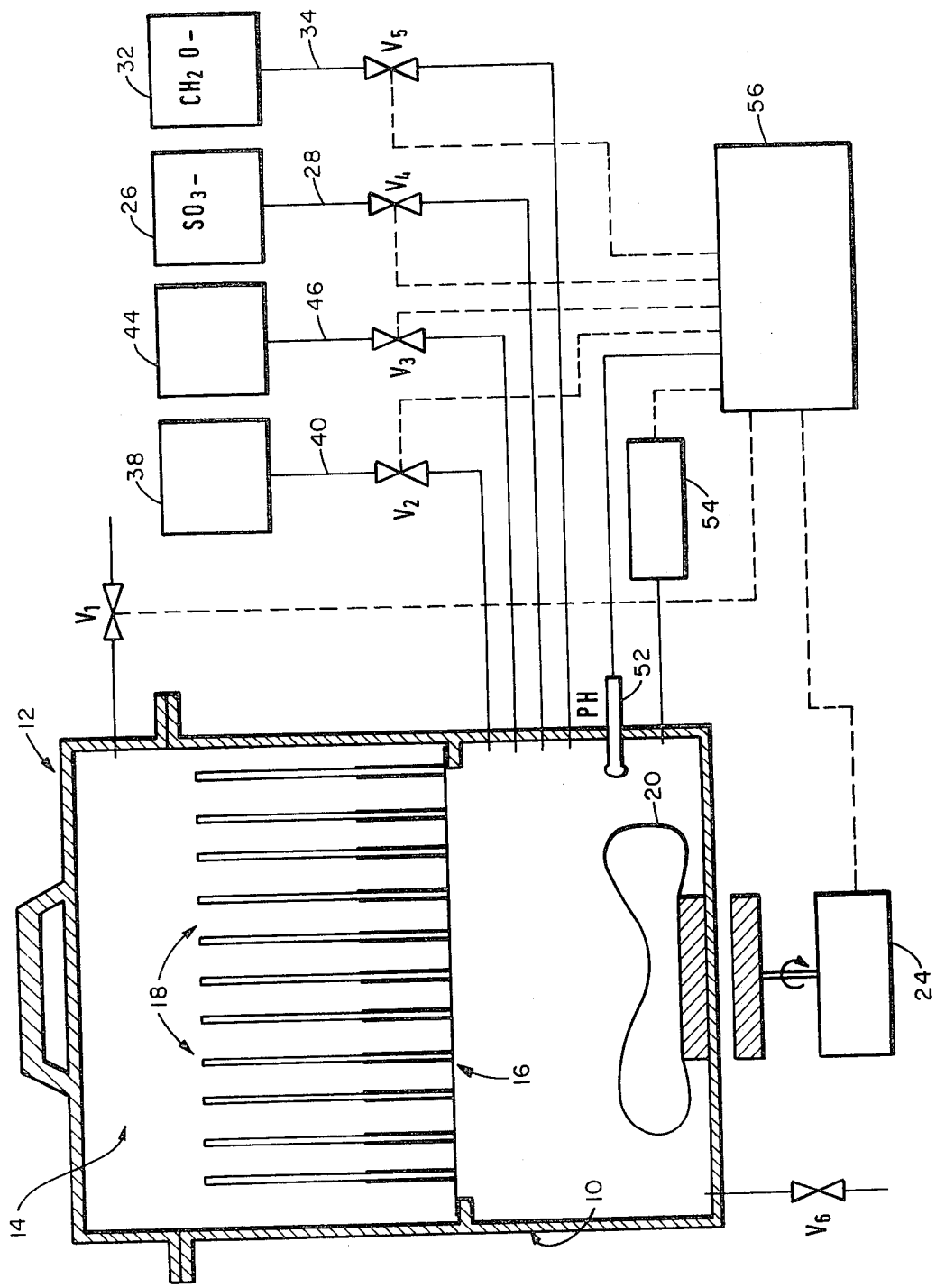

PROCESS FOR METAL-COATING PLASTIC SURFACES

The invention relates to a process for metal-coating plastic surfaces, and more particularly to a process for chemically pretreating plastic surfaces with an acid pickling agent whereby to prepare the plastic surfaces for the subsequent superposition thereon of a metal layer by an optionally subsequent galvanic process without external current.

The chemical metal-coating of plastic materials with good adherence of the metal film is known to require an intensive chemical pretreatment of the plastic surface. One type of chemical pretreatment known in the art consists of pickling the plastic surfaces with modified chromosulfuric acid bath. However, this pretreatment process is limited in application to only a few types of plastic materials such as ABS plastic and polypropylene. In addition to the small number of plastic materials that can be used in this pretreatment process, the recovery and waste disposal of the consumed chromosulfuric acid bath is specially problematic and very expensive.

Another process for chemical pretreatment of plastic surfaces preparatory to the chemical metal-coating is disclosed in German Pat. No. 2,126,781. This patent discloses pretreating the plastic surface by exposing the plastic surface to an $SO_3$-containing gaseous phase in a container. This pickling treatment results in a chemical modification of the plastic surface whereby a satisfactory adherence of the metal film is achieved without microscopically visible abrasion. The variety of plastic materials that can be used with this latter process is considerably extended as compared with those pretreatable with chromosulfuric acid, and include polyethylene, PVC, epoxy resin, phenol resin, styrene-acrylonitrile polymer and others.

However, the process described in the aforesaid German Pat. No. 2,126,781 presents a number of technical problems:

For one, there results a charging of the atmosphere with extremely corrosive $SO_3$, or highly concentrated sulfuric acid formed by the contact of the $SO_3$ with air moisture. Thus, when the article to be treated is introduced into the $SO_3$-containing gaseous phase, or withdrawn therefrom, large amounts of $SO_3$ gas are released into the atmosphere and can be removed only with difficulty and at high cost. The $SO_3$ gas is released into the atmosphere both from openings in the gas container when the plastic article is introduced into and withdrawn from the container, and by desorption of $SO_3$ from the surfaces of the articles treated.

Furthermore, when the article is discharged from the vessel, there forms in fragments of a second on the surface of the article a film of concentrated sulfuric acid resulting when part of the $SO_3$ absorbed on the surface of the article contacts moisture in the surrounding air. Concentrated sulfuric acid in the form of a thick white haze that very easily deposits on the surface of the article also may be formed in $SO_3$ gas containers from moist air that is introduced into the gas container as the article enters and leaves the container. While the highly concentrated sulfuric acid that may reach the plastic surface by either of the aforesaid methods may not effect the desired chemical modification of the surface, it may decompose and carbonize the plastic surface such as to render the plastic surface unsuitable for subsequent use since subsequent chemical metal-coating of such a decomposed and carbonized plastic surface may produce a stained metal film of poor adhesiveness that in turn would not permit satisfactory galvanic treatment or chemical reinforcement of the surface.

Another problem in the process of German Pat. No. 2,126,781 is that sulfuric acid may deposit on the walls of the container where it can react in the next charge with the $SO_3$ of the gaseous phase, thus rendering impossible the control of the specific concentration of $SO_3$ in the gaseous phase.

A similar process for the $SO_3$-gaseous phase pickling of plastic surfaces is described in French Pat. No. 7,427,431. However, this process described in this latter patent also has the problem of solid reaction products remaining in the reaction vessel which may interfere with the control of the concentration of the next charge.

Moreover, $SO_3$ treatment in the gaseous phase also is not suitable for plastic materials such as Plexiglass since with such treatment, the surface molecules are partly depolymerized under the action of $SO_3$, and there results in the subsequent treatment in aqueous solutions (for surface activation and chemical metal deposition) a sticky or tacky surface impossible to use for metal-coating.

Therefore, a principal object of the invention is to provide an improved process that overcomes the above mentioned disadvantages of the prior art. Another principal object is to provide a process for the pretreatment of plastic surfaces preparatory to subsequent superposition thereon of a metal layer, and to produce a uniform and firmly adherent chemical and/or galvanic metal-coating on the plastic surfaces.

According to the invention there is provided a process for pretreating plastic surfaces by means of a gaseous phase pickling agent in a reaction vessel, and terminating the chemical pretreatment by introducing a selected gaseous material into the reaction vessel in contact with the gaseous phase pickling agent so as to produce non-corrosive gaseous reaction products such as esters or acetals. If desired, the chemically pretreated plastic surface may then be treated with an aldehyde in solution.

Preferably the gaseous phase pickling agent comprises $SO_3$ and/or $HSO_3Cl$, and the selected material for terminating the pickling comprises an aldehyde such as $CH_2O$ or $CH_3CHO$ or an alcohol such as $CH_3OH$ or $CH_3CH_2OH$.

By carefully dosing the gaseous or vaprous chemicals selected for terminating the pickling, it is possible, after the pretreatment and a brief gas flushing or vacuum clearing the reaction vessel, to open the reaction vessel without releasing corrosive pickling agent vapors. The plastic surface is thereby covered with a layer of harmless nonreactive reaction products of the reaction of the pickling agent with the plastic surface, which layer can easily be washed off with water. The washing operation can be omitted if only traces of the reaction products of the pickling are present and/or do not interfere with the surface activation that follows. The pretreatment is thus simplified. In the case of many plastic materials such as Plexiglass that tend to depolymerization (softening) of their surfaces, there must be carried out, for a satisfactory subsequent metal-coating, a succeeding treatment in an aldehyde solution such as an aqueous formaldehyde solution of concentration in the range of 5 to 37% at room or elevated temperature for a period of 1 to 30 minutes. If the pickling is terminated with aldehyde vapor or gas such as $CH_2O$ gas, the succeeding treatment with the aldehyde solution can normally be omitted for such plastic materials.

This invention makes possible a pretreatment for chemical metal-coating of a large number of plastic materials without (a) producing environmental pollution from escape of unreacted pickling agent such as $SO_3$ and/or $HSO_3Cl$, (b) the surface becoming overpickled during or after the treatment with $SO_3$ and/or $HSO_3Cl$, or coming into contact with concentrated sulfuric acid and thereby being changed so as to become useless, (c) having to clean the reaction vessel after very short intervals of time (for instance, after each batch) to eliminate solid precipitation products.

The introduction of a process step to terminate the pickling in accordance with the present invention makes possible relatively simple construction of the reaction equipment that prevents the emission of corrosive gases, thus permitting the carrying out in a large scale the gaseous-phase pickling.

Further objects and certain advantages of the present invention may be understood with reference to the drawing which is a block diagram showing exemplary reaction equipment and method in accordance with the invention.

Referring to the FIGURE the reaction equipment comprises a reaction vessel 10 having a removable, sealable lid 12, and defining a reaction zone 14. A support carrier or grid 16 is disposed within the vessel 10 for supporting the articles 18 to be treated in spaced relation from one another within reaction zone 14. Also mounted with the reaction zone 14 is a magnetic stirring means 20 of convention construction. The latter is driven by means of a magnetic turning drive 22 and stirring motor 24 mounted external of the reaction vessel 10.

The pickling gas (e.g. $SO_3$) is supplied to reaction vessel 10 from a supply 26 via a line 28 and control valve $V_4$. The pickling termination gas (e.g. $CH_2O$) is supplied to reaction vessel 10 from a supply 32 via a line 34 and control valve $V_5$. The apparatus also includes a vacuum source such as a suction pump 38 which is connected to reaction vessel 10 via a line 40 and control valve $V_2$, and a source of 44 a dry purge gas which is inert with respect to the acid pickling agent, e.g. $O_2$, $N_2$, $CO_2$, a rare gas or dry air which is connected to vessel 10 via a line 46 and control valve $V_3$, and one or more valved vent lines indicated generally at $V_1$ and $V_6$. The latter are vented to the atmosphere. Completing the apparatus are the chemical reaction monitor means and controls such as a pH sensor 52, for example, a pH electrode with highly sensitive measuring instrument or a capacitance analyzer, or other control, a manometer 54, and a monitor readout and a central control means indicated generally at 56. The latter may comprise manual control means, or it may comprise suitable logic to make the apparatus semi-automatic or fully automatic, as desired.

Preferably the acid pickling agent is supplied to the reactor vessel chamber at room or slightly elevated temperature at a (partial) vapor pressure in the range of between about $10^{-4}$ and about $10^{-2}$ bar, and maintained in contact with the plastic material for a period of time in the range of about 30 seconds to about 30 minutes. One skilled in the art can determine the optimum temperature, vapor pressure and contact time for the particular plastic material being pretreated.

The overall process is carried out in reaction vessel 10 as follows:

charging said reactor vessel chamber with the articles to be treated while flushing said chamber with a dry inert gas;

partially evacuating said reactor vessel chamber;

introducing a predetermined quantity of a selected gaseous pickling agent, if desired mixed with a dry inert gas, and maintaining said gaseous pickling agent in contact with said articles at a specific temperature for a specific period of time, according to the following Formula:

$^{vol}$ pickling agent at $p < ^{vol}$ pumped out inert gas at p (p=specific, preferably reduced, pressure);

introducing a predetermined quantity of a gaseous selected material which material is (1) reactable with said gaseous pickling agent, (2) to thereby form a gaseous reaction product thus terminating said pickling, if desired, mixed with a dry inert gas, at a specific temperature, according to the following Formula:

$^{vol}$ pickling agent at $p' + ^{vol}$ pickling stopper such as esterification and/or acetalization agents at $p'$ $\leq ^{vol}$ pumped out inert gas at $p'$ ($p'$ = specific, preferably reduced, pressure);

balancing the pressure with dry inert gas and brief flushing with the dry inert gas to remove said resulting gaseous reaction products;

removing the treated articles from said reaction vessel chamber; and, introducing fresh articles to be treated while flushing with dry inert gas.

The following samples illustrate certain and preferred modes of practicing apparatus shown in the drawing.

EXAMPLE I

The plastic article to be treated is stacked on a carrier 16 and introduced into a sealable reaction chamber, while the chamber is flushed with dry air 44 under control of valve $V_3$. By more flushing with air (with open valve $V_1$) the moisture is removed as much as possible from the reaction chamber after the equipment is closed, and the article is brought to the corresponding temperature (for instance, room temperature). After shutting valves $V_1$ and $V_3$, the reaction chamber is partly evacuated (for example, from 1000 mbar to 700 mbar) via a vacuum source 38 under control of valve $V_2$. Then follows the acid gaseous-phase pickling by the addition of a measured quantity of $SO_3$ through the valve $V_4$ from a source of $SO_3$ 26 (for example, $SO_3$ liquid from the firm Fluka or $SO_3$ from 65% oleum). During the induction and pickling period of the $SO_3$ (for example, 1 minute with 2% volume of $SO_3$) the gas volume is vigorously stirred to obtain a uniform pickling. Thereafter a measured quantity of gaseous $CH_2O$ (for example, from a pressure bottle or after drying from an aqueous solution of $CH_2O$) is added from source 32 through valve $V_5$ under vigorous stirring to effect acetalization of any free $SO_3$ in the reaction chamber, preferably with a small excess of $CH_2O$. The addition of gaseous $CH_2O$ is regulated with pH sensor 52. After terminating the acetalization, the reaction chamber is aerated through valve $V_3$ until reaching ambient pressure, then by additionally opening $V_6$ the gaseous reaction products are removed, the treated article is replaced with a fresh, untreated article, and the process repeated.

The whole process is controlled automatically by a central control 56.

The pickled article is washed and metal-coated according to the following known steps:

First the surface of the article is sensitized in an aqueous solution of 50 g/l concentrated hydrochloric acid and
5 g/l tin-II-chloride at room temperature for 1 minute, and washed with distilled water.

The surface is then activated in an aqueous solution of 10 g/l concentrated hydrochloric acid
0.5 g/l palladium-II-chloride at room temperature for 1 minute, and washed with distilled water.

Chemical metal-coating in an aqueous solution of 15 g/l nickel sulfate
30 g/l sodium hypophosphite
15 g/l borax
17 g/l citric acid follows at pH 9 at room temperature for 10 minutes, followed by washing with distilled water.

Galvanic (or chemical insofar as possible) reinforcement with copper, nickel, chromium, etc. may then be effected, as desired, in known manner.

The resulting product comprises a metal-coated plastic article with commercial acceptable adherence of the metal-coating to the plastic surface.

For example, in galvanic reinforcement with copper on 20 μm, the adhesive strengths obtained in the metal-coating was to 40 N/25 mm on epoxide surfaces, 80 N/25 on glue-coated FR4 material (adhesive on a nitrile rubber base), and 50 N/25 mm on Capton (polyimide).

EXAMPLE II

Example 1 repeated with the following change:—In place of $SO_3$, $HSO_3Cl$ was used as acid pickling medium. The concentration of $HSO_3Cl$ was 3% by volume, and the temperature was 60° C. The pickling period was 20 minutes. As before the materials coated were Capton (polyimide), epoxide and glue-coated epoxide (on a nitrile rubber base); and the adhesive strengths after galvanic reinforcement of the nickel plating to 20 μm copper amounted respectively to 50 N/25 mm, 40 N/25 mm and 70 N/25 mm.

EXAMPLE III

Example I was repeated with the following change:—In place of $CH_2O$ as pickling terminator, $CH_3OH$ was used. The adhesive strengths of the metal-coating in this process, were substantially the same as in Example I.

EXAMPLE IV

Plexiglass was pickled following the process of Example I. Prior to the nickel plating there was additionally carried out a pretreatment of the substrate in an aqueous 35% $CH_2O$ solution for 2 minutes at room temperature, followed by washing with distilled water. The adhesive strength was 50 N/25 mm.

EXAMPLE V

ABS, polyethylene and polypropylene were pretreated following the process of Example I. The adhesive strengths of these plastic materials amounted to 60 N/25 mm.

Certain changes will be obvious to one skilled in the art and may be made in the above disclosure without departing from the scope of the invention herein involved. Accordingly, it is intended that all matter contained in the above description or shown in the accompanying drawing shall be interpreted in an illustrative and not in a limiting sense.

I claim:

1. In a process for preparing plastic surfaces for the subsequent superposition of a metal layer thereon, the chemical pretreatment of said surfaces with an acid pickling agent, the improvement which comprises carrying out the chemical pretreatment in a gaseous phase in a closed container, terminating said chemical pretreatment by chemically reacting said pickling agent with a gaseous reactant in said closed container to thereby produce a non-corrosive reaction product.

2. In a method according to claim 1, and including the step of treating the chemically pretreated plastic surface with an aldehyde prior to superposition of said metal layer thereon.

3. In a process according to claim 1, the improvement which comprises producing in the gaseous phase at room, or slightly elevated temperature a (partial) vapor pressure of the pickling agent optimized for the respective plastic material to be pickled, and maintaining said (partial) vapor pressure of the pickling agent between about $10^{-4}$ and about $10^{-2}$ bar, in said closed container for a period of time in the range of about 30 seconds to about 30 minutes.

4. In a process according to claim 1, the improvement wherein said gaseous phase comprises in addition to said acid pickling agent a dry gas that is inert in respect to said acid pickling agent.

5. In a process according to claim 4, the improvement wherein said dry gas is selected from the group consisting of $O_2$, $N_2$, $CO_2$, a rare gas and air.

6. In a process according to claim 1, the improvement wherein said acid pickling agent is selected from the group consisting of sulfur trioxide and/or chlorosulfonic acid.

7. In a process according to claim 1, the improvement which comprises terminating the acid pickling pretreatment by a selected chemical process under conditions in which the reaction products resulting from said terminating chemical process remain predominantly in the gaseous phase.

8. In a process according to claim 7, the improvement which comprises terminating the acid pickling treatment in the gaseous phase by the gaseous phase esterification with an alcohol.

9. In a process according to claim 8, the improvement wherein said alcohol is selected from the group consisting of $CH_3OH$ and $CH_3CH_2OH$.

10. In a process according to claim 1, the improvement which comprises terminating the acid pickling treatment by the gaseous phase acetalation of said acid pickling agent with an aldehyde.

11. In a process according to claim 10, wherein said aldehyde is selected from the group consisting of $CH_2O$ and $CH_3CHO$.

12. In a process according to claim 1, the improvement which comprises terminating the chemical pretreatment substantially at room temperature.

13. In a process according to claim 2, the improvement which comprises carrying out said subsequent treatment with an aqueous formaldehyde solution of concentration in the range of 5 to 37%, at room or elevated temperature for a period of 1 to 30 minutes.

14. In a process according to any one of claims 1 to 13, the improvement wherein said process is carried out in a closed vacuum chamber reactor vessel, and including the steps of:

introducing a quantity of a gaseous material which is reactable to complete esterification and/or acetalization with said gaseous pickling agent to whereby form a gaseous reaction product;

maintaining the pressure in the reactor vessel at reduced pressure during said process and balancing the pressure on said vessel with dry inert gas whereby to prevent escape of pickling agent by leakage from said vessel;

upon completion of said esterification and/or acetalization flushing said vessel with gas to remove said resulting gaseous reaction products; and removing the treated articles from said reaction vessel chamber, and introducing fresh articles to be treated while flushing with dry inert gas.

* * * * *